United States Patent [19]
Galloway

[11] Patent Number: 5,390,972
[45] Date of Patent: Feb. 21, 1995

[54] WAFER CASSETTE HANDLE

[75] Inventor: Judy U. Galloway, Fair Oaks Ranch, Tex.

[73] Assignee: VLSI Technology, Inc., San Jose, Calif.

[21] Appl. No.: 12,680

[22] Filed: Feb. 3, 1993

[51] Int. Cl.⁶ .............................................. B65D 25/28
[52] U.S. Cl. .................................... 294/27.1; 294/15; 16/114 R
[58] Field of Search ................... 294/15, 16, 26, 27.1, 294/33, 34, 131; 29/758, 764; 16/114 R

[56] References Cited

U.S. PATENT DOCUMENTS

| | | | |
|---|---|---|---|
| 3,701,558 | 10/1972 | Baker | 294/33 |
| 3,867,753 | 2/1975 | Urban, II et al. | 294/15 X |
| 3,923,191 | 12/1975 | Johnson | 294/33 X |
| 3,939,973 | 2/1976 | Wallestad | 294/27.1 X |
| 4,515,104 | 5/1985 | Lee | 294/27.1 X |
| 4,595,222 | 6/1986 | Schumacher | 294/34 X |
| 4,723,799 | 2/1988 | Wollmann et al. | 294/16 X |
| 5,029,922 | 7/1991 | DiNapoli et al. | 294/27.1 |
| 5,110,001 | 5/1992 | Dunn | 294/33 |

OTHER PUBLICATIONS

IBM Technical Disclosure Bulletin, vol. 19, No. 3, Aug. 1976.

Primary Examiner—Dean J. Kramer
Attorney, Agent, or Firm—Hickman & Beyer

[57] ABSTRACT

Disclosed is an apparatus and method for transporting wafer cassettes. A wafer cassette handle is characterized by an elongated cylindrical handle positioned horizontal and in parallel to the front face of a wafer cassette and attached to the cassette by engagement members engaging grooves provided in the cassette. The operator's hand carries the handle and cassette by grasping the handle in an underhand grip with the back of the hand engaging the front face of the cassette or a support plate connected to the handle. The underhand grip minimizes wrist strain and encourages operators to hold the cassette high in the air, where particulate contamination is at a minimum.

19 Claims, 6 Drawing Sheets

WAFER CASSETTE HANDLE

BACKGROUND OF THE INVENTION

1. Field of the Invention

This invention relates to semiconductor manufacturing, and more specifically to methods and apparatus for transporting wafer cassettes.

2. Background of the Related Art

Integrated circuit chips are usually formed on silicon wafers. Typically, the electrical and physical characteristics of these wafers are tested before chips are manufactured from the wafers. The testing is usually accomplished by a testing apparatus that sequentially tests wafers held in slots of a wafer cassette. The wafers are usually transported by production personnel between the various testing apparatus and manufacturing equipment in these wafer cassettes.

A typical problem in transporting wafers is particulate contamination. Even in industrial clean rooms, particles drift in the air and settle on wafers, degrading the quality of the wafers. Contaminant particles usually drift close to floor level, so that if wafers are transported at or above head level, much of the contamination on the wafers can be reduced.

There are several types of commercially available wafer cassette handles. The handles typically can be attached to a cassette for transport and then can be removed from the cassette when the cassette has been carried to a testing or destination area. The handles can be used to lift a cassette to or above head level during transport to reduce contamination.

A typical wafer cassette handle of the prior art is shown in FIG. 1a. The cassette handle 10 consists of attaching support 12 capable of engaging an edge of a wafer cassette, and a handle 14 extending away from the support 12. The support 12 includes L-shaped members 16a and 16b that engage grooves or flanges provided along an edge of a wafer cassette. Wafer cassette handles such as the one shown in FIG. 1a can be purchased from Fluoroware, located in Chaska, Minn., as model A055.

FIG. 1b shows the handle 10 attached to a typical wafer cassette 18. The cassette is approximately rectilinear and includes a number of parallel slots 19 to hold wafers in the interior of the cassette. The handle 10 is typically attached proximate a front face 22 of the cassette 18. The L-shaped members 16a and 16b engage slots 20a and 20b in the wafer cassette and the handle is moved upwardly from the bottom of the cassette along the front face 22 until they engage stops 24a and 24b, respectively.

FIG. 1c shows a production worker lifting the wafer cassette 18 by the handle 10. This holding position works for short, horizontal movement of the wafer cassette. However, if the cassette needs to be transported a relatively long distance, or if the cassette must be lifted vertically, this holding position can cause considerable wrist strain, as illustrated at 25. This strain can be a problem for operators who must transport many cassettes during a work day. The strain is worsened when the cassette is lifted to or above head level.

What is needed is a cassette handle that will allow a wafer cassette to be transported easily and with less strain than the previously-used handles. The cassettes should be able to be lifted and carried at a high level with little strain to reduce the particulate contamination on the wafers.

SUMMARY OF THE INVENTION

The present invention addresses the problems in the prior art by providing a method and apparatus to hold a wafer cassette that includes a removable handle that is designed to be grasped in an underhand fashion. Carrying a cassette with the handle of the present invention eases wrist strain and allows the cassette to be carried at a high elevation to reduce contamination of the wafers in the cassette.

The apparatus comprises an attachment support and a handle grip. The attachment support is similar to attachments on previous handles so that the handle can engage standard wafer cassettes. The attachment support preferably includes two L-shaped members that engage grooves or flanges provided on the wafer cassette.

The handle grip of the present invention preferably includes an elongated, cylindrical member that is aligned horizontally and parallel to the face of the cassette. The handle is grasped in an underhand fashion so that the back of the hand engages the face of the cassette or, in another embodiment, a support plate of the handle that is substantially parallel to the face of the cassette.

The present invention has the advantage of providing an apparatus and method that allows the back of the hand to assist in supporting the weight of the cassette. The invention also has the advantage of allowing production personnel to comfortably carry a wafer cassette in an elevated position with less wrist stain than the previous cassette handles.

These and other advantages of the present invention will become apparent to those skilled in the art after reading the following descriptions and studying the various figures of the drawings.

DETAILED DESCRIPTION OF THE PREFERRED EMBODIMENTS

Figure 1A:
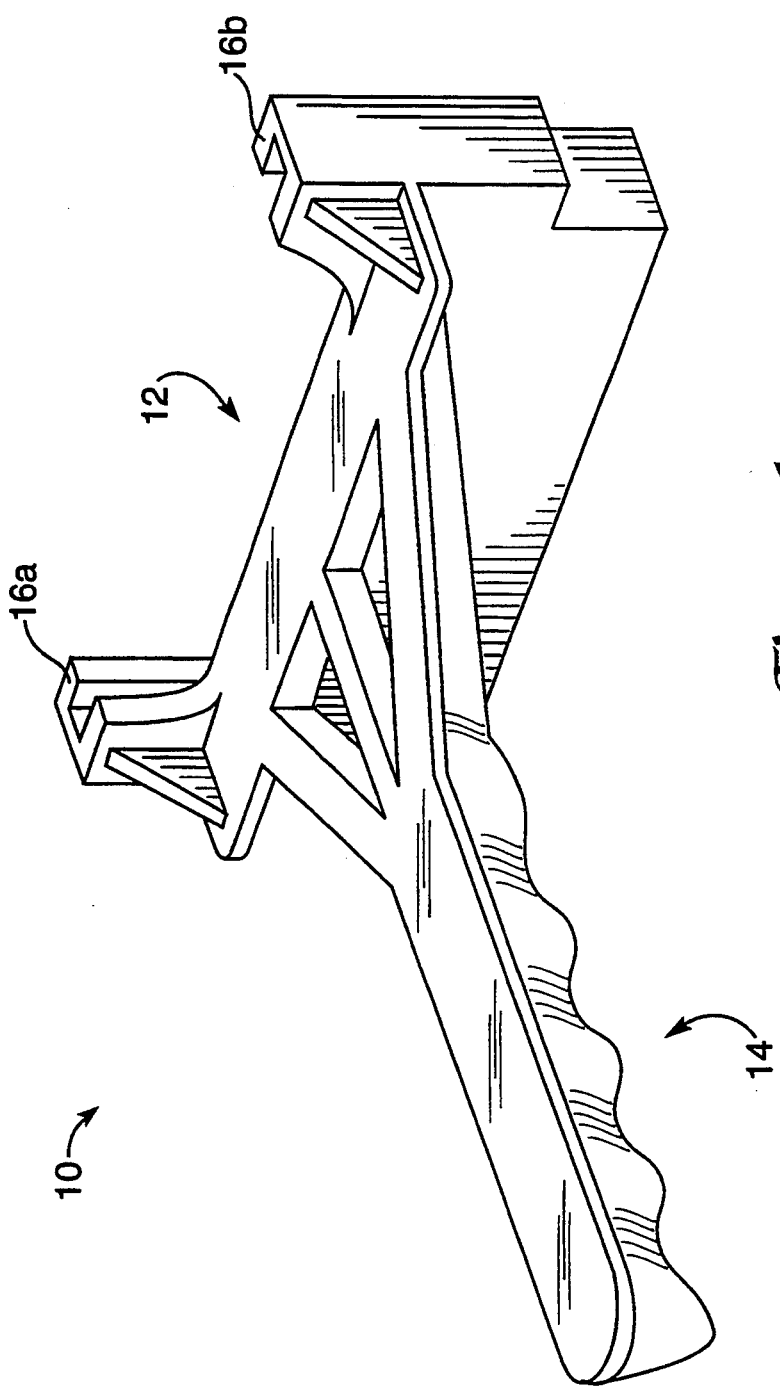
FIG. 1a is a perspective view of a prior art wafer cassette handle.
Figure 1B:
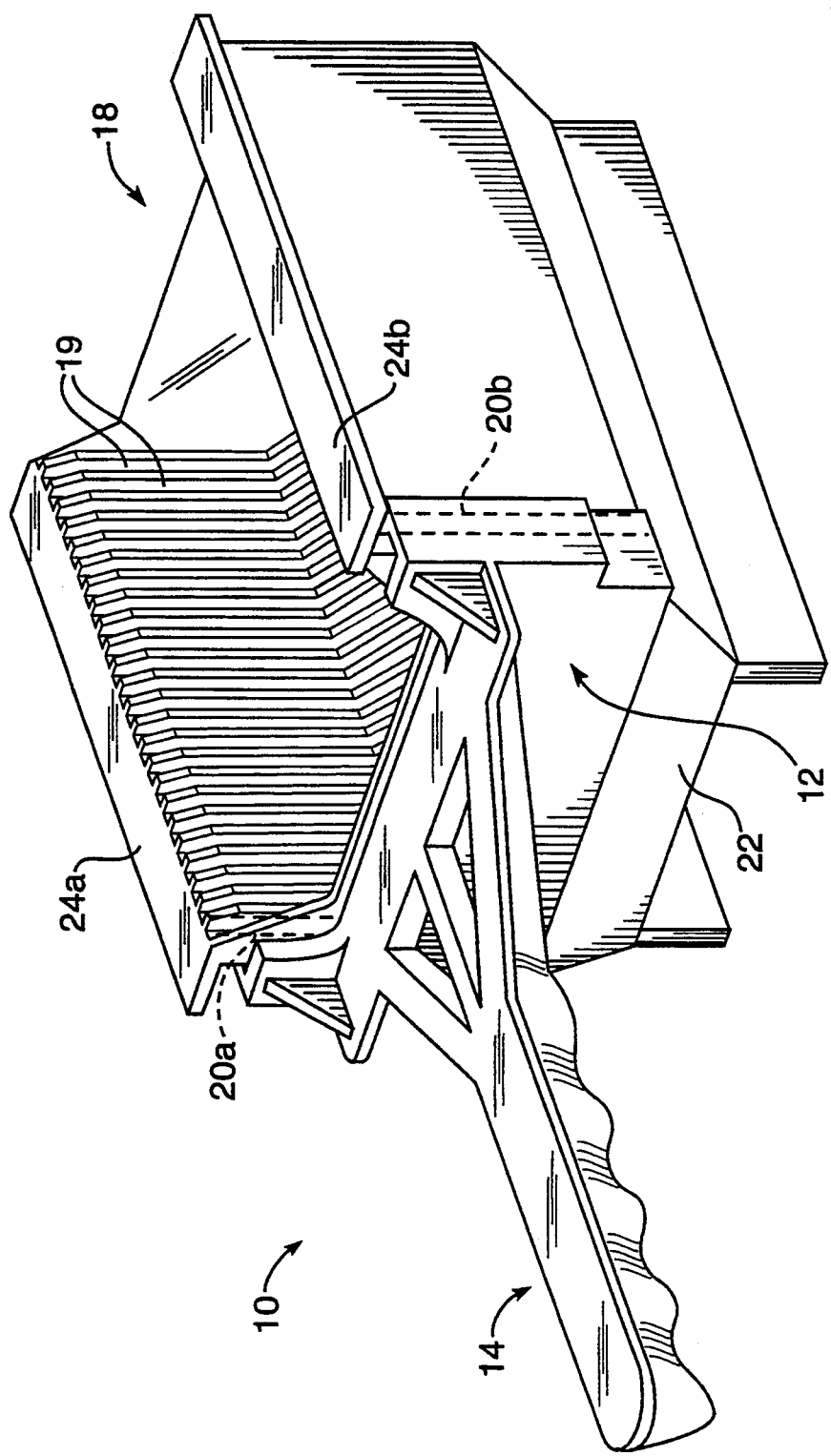
FIG. 1b is a perspective view of the prior art wafer cassette handle of FIG. 1a engaged with a wafer cassette.
Figure 1C:
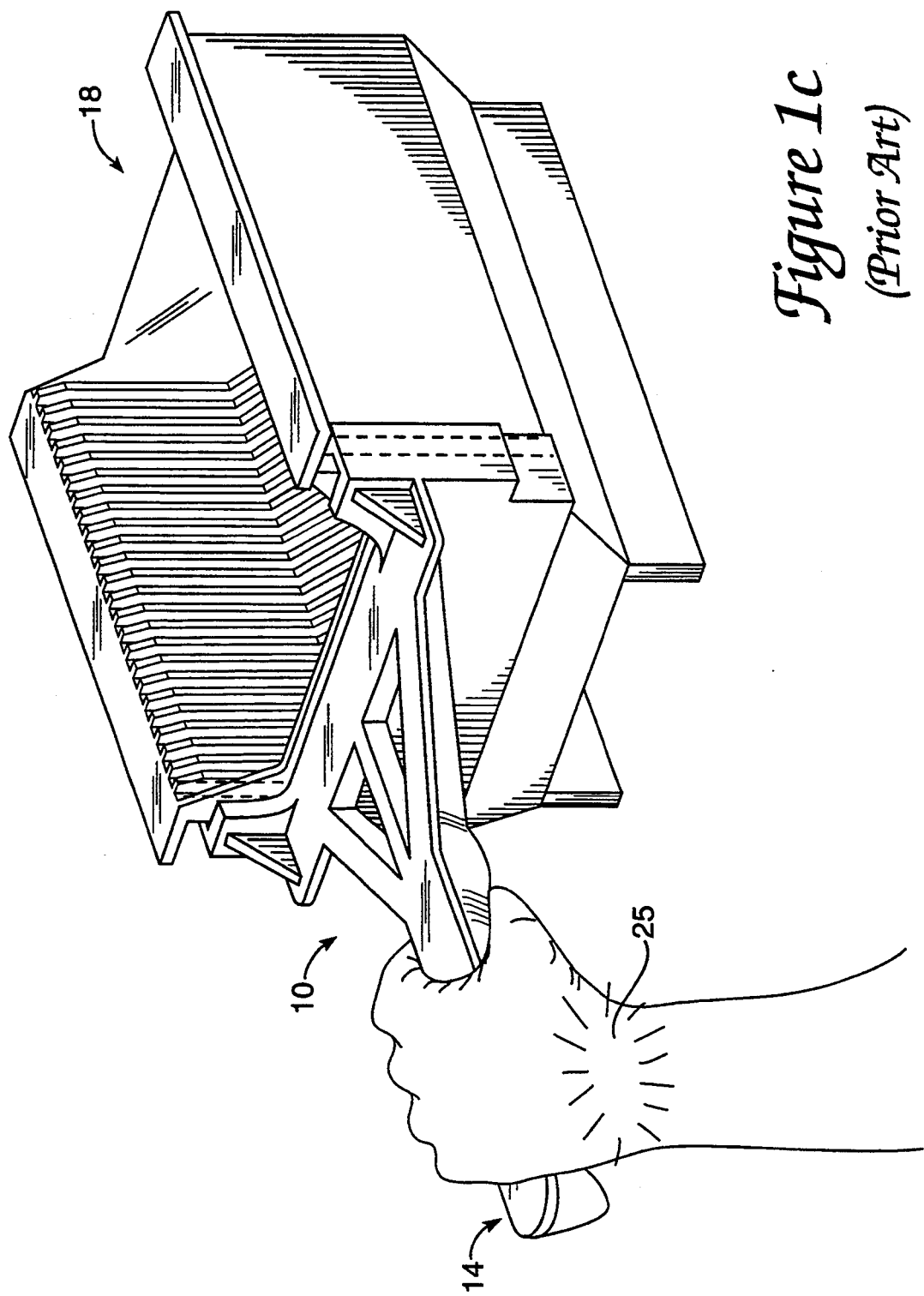
FIG. 1c is perspective view of a hand grasping the prior art wafer cassette assembly of FIG. 1b.
Figure 2:
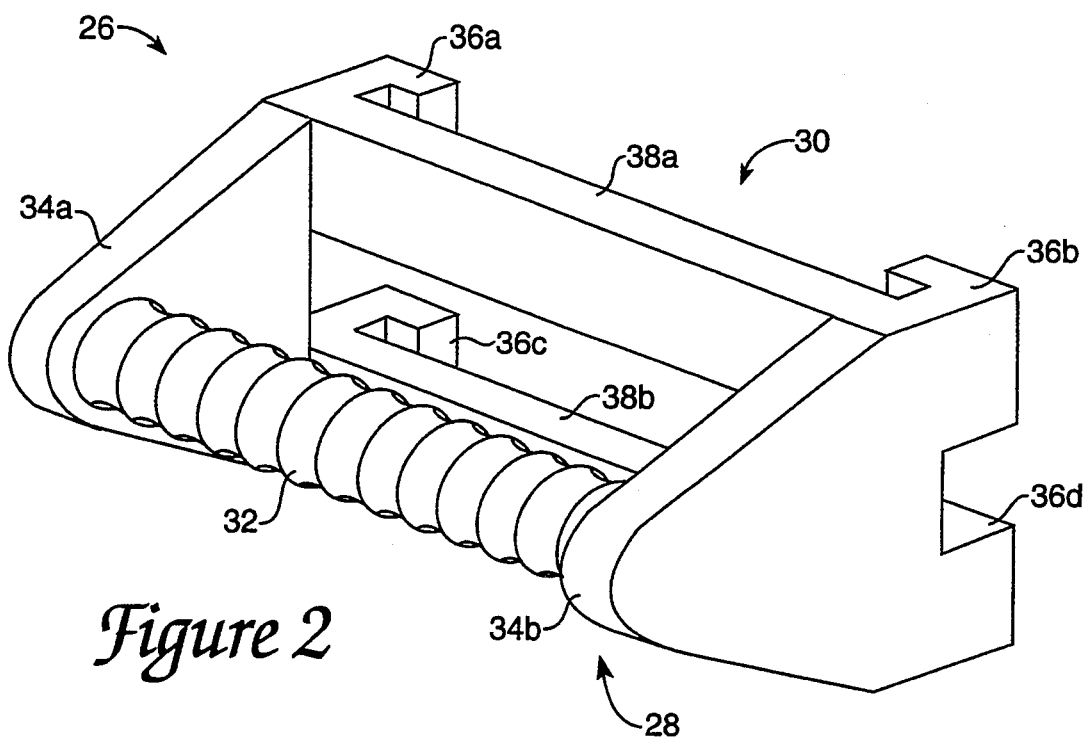
FIG. 2 is a perspective view of a wafer cassette handle of the present invention.

A prior art wafer cassette handle was previously described with reference to FIGS. 1a, 1b and 1c. In FIG. 2, a wafer cassette handle 26 of the present invention is shown. Wafer cassette handle 26 comprises a grip portion 28 and an attachment portion 30.

Grip portion 28 comprises an elongated handle 32 and handle supports 34a and 34b. Elongated handle 32 is substantially cylindrical and has a diameter of about 1.25–1.5 inches. It is preferably made of a strong metal or plastic. The elongated handle can be a smooth cylinder, or it can be contoured to fit a hand or shaped and textured with ridges, dimples, etc. The elongated handle 32 is attached at its ends to the two handle supports 34a and 34b.

Attachment portion 30 comprises L-shaped members 36a, 36b, 36c, and 36d and support plates 38a and 38b. L-shaped members 36a and 36b are connected to support plate 38a, and L-shaped members 36c and 36d are connected to support plate 38b. Plates 38a and 38b extend between supports 34a and 34b. The L-shaped members are adapted to engage two tracks, grooves, or flanges of a wafer cassette.

Plates 38a and 38b are spaced from the elongated handle 32 by approximately the width of a human hand (e.g. 1.5–2 inches) so that a hand can be inserted between the handle 32 and the plates 38a and 38b to grasp the handle. The support plates are positioned to be substantially parallel with a flat surface of the wafer cassette to which the handle 26 is connected (see below). The plates 38a and 38b can also comprise a single plate (not shown) extending between supports 34a and 34b. The support plates 38a and 38b can also be contoured with a concave shape that snugly fits the back of a hand.

In an alternate embodiment of the present invention, the handle supports 34a and 34b can be connected to the L-shaped members and rile support plates 38a and 38b can be eliminated. In such an embodiment, the elongated handle 32 provides the support between the opposing L-shaped members and handle supports, and the back of the hand engages a side of a wafer cassette being carried.

Figure 3:
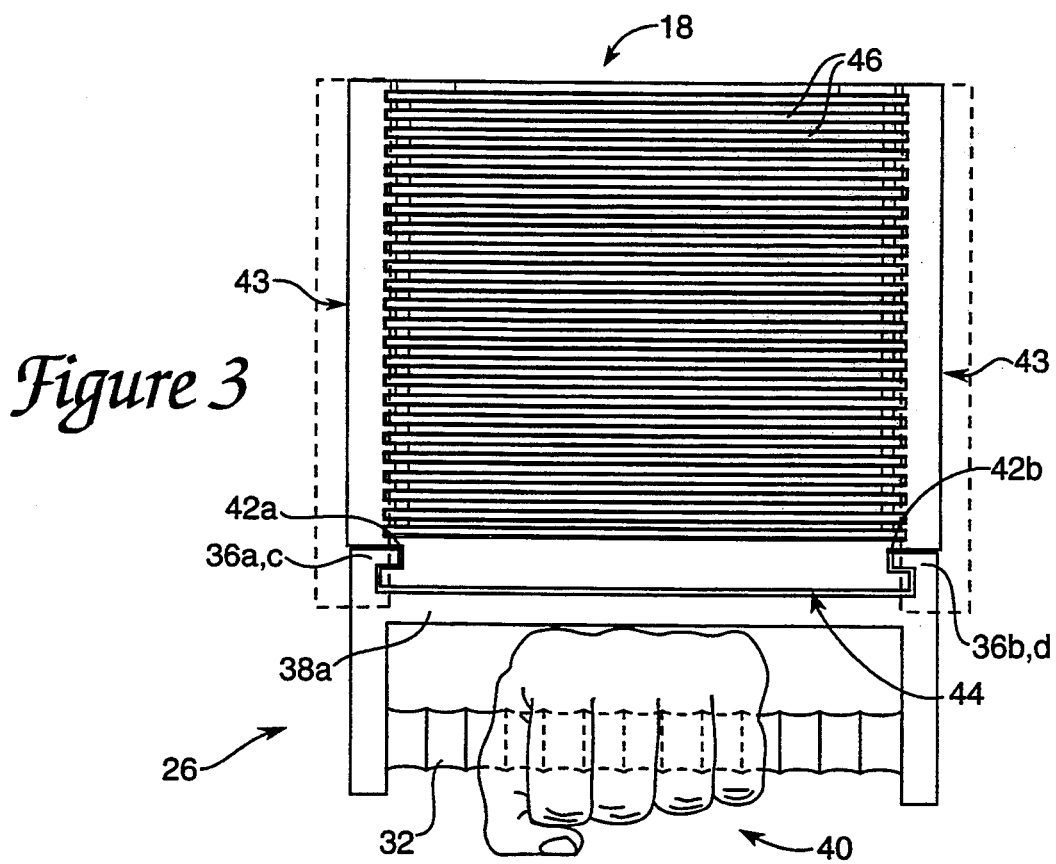
FIG. 3 is a top plan view of a hand holding the wafer cassette handle of FIG. 2 after it has been engaged with a wafer cassette.

FIG. 3 is a top plan view of the wafer cassette handle 26 attached to a wafer cassette 18. A hand 40 is holding the handle in an underhand grip. The L-shaped members 36a,c and 36b,d are engaged with grooves 42a and 42b, respectively, which are positioned in the sides 43 of the cassette 18. Support plates 38a and 38b are positioned in parallel with a front face 44 of the cassette. Wafers 46 are held in the cassette parallel to the front face 44 in most wafer cassettes.

Figure 4:
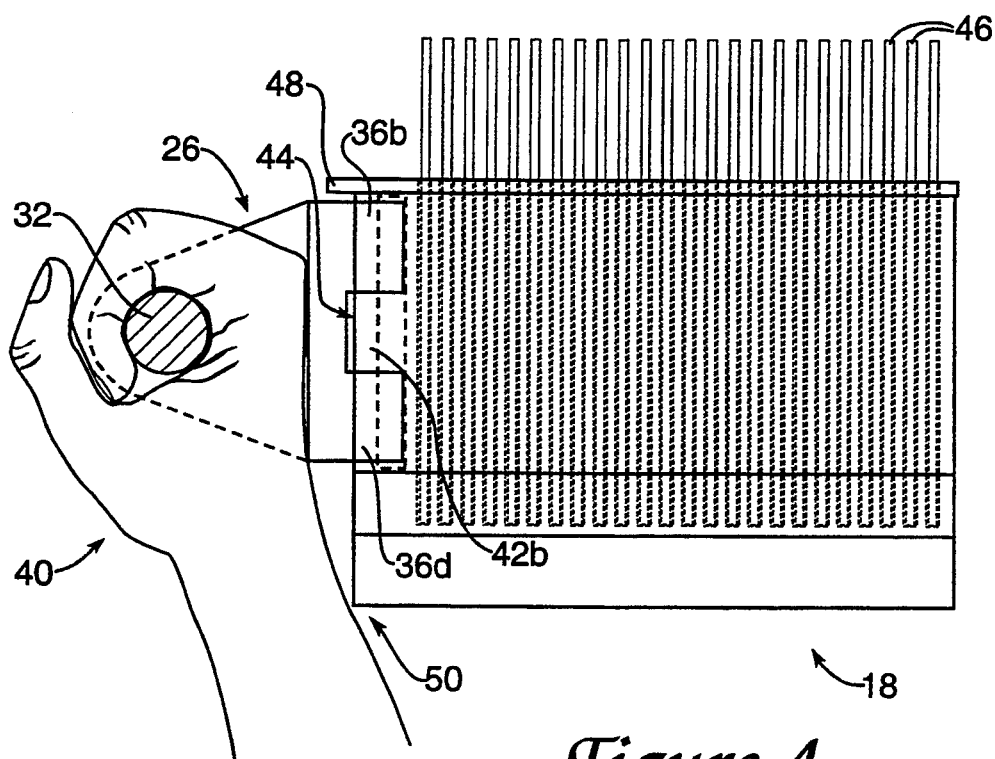
FIG. 4 is a side elevational view of FIG. 3.

FIG. 4 is a side elevational view of the wafer cassette handle 26, cassette 18, and hand 40. The L-shaped members 36b and 36d are engaged with vertical groove 42b in the vertical side face of the cassette 18. By 'vertical' it is meant that the sides of the cassette and grooves extend upwardly in a normal, upright cassette orientation. The handle 26 can slide upwardly in grooves 42a and 42b to the top of the cassette 18 until it is stopped by stops 48, which prevent the handle 26 from disengaging from grooves of the cassette.

The hand 40 is shown gripping the elongated handle 32 in an underhand fashion. "Underhand grip" is defined here as the grip resulting from positioning the hand underneath the handle 26, moving the fingers upwardly between the elongated handle and the support plate, cuffing the fingers down over the elongated handle, and cuffing the thumb upwardly from the other side of the handle. The back of the hand is engaged with support plates 38a and 38b and the back of the arm below the wrist may be engaged with a corner 50 of the cassette 18. These support points can reduce wrist strain when carrying the cassette.

In an alternate embodiment where the support plate 38 is eliminated, the back of the hand rests against the front face 44 of the wafer cassette. In such an embodiment, the handle supports 34a and 34b can be shortened so that the elongated handle 32 is closer to the front face 44, allowing the back of the hand to more easily engage the front face of the cassette.

Since the hand 40 and arm are already facing upwardly when holding the handle 26, the cassette can be comfortably held at or above head height. Wafer cassettes are carried at these heights to decrease the contamination on the wafers in the cassette. The wafers are therefore exposed to much less contaminant particles, thus preventing degradation of the wafers and increasing the yield of a batch of wafers.

Figure 5:
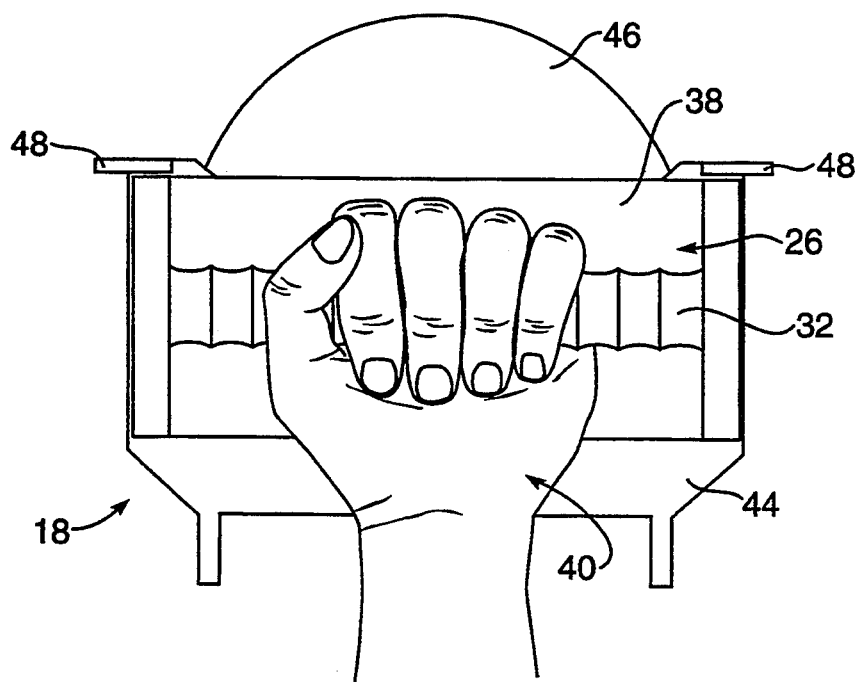
FIG. 5 is a front elevational view of FIG. 3.

FIG. 5 is a front elevational view of the handle 26, the cassette 18, and the hand 40. The elongated handle 32 is shown extended substantially horizontally and parallel to the front face 44 of the cassette. 'Horizontally' here means substantially perpendicular to the vertical direction in a normal upright cassette orientation. The width of the handle 26 is shown to be slightly wider than a human hand. Other embodiments of the present invention have an elongated support plate 38b which extends down to the wrist for added support.

Figure 6:
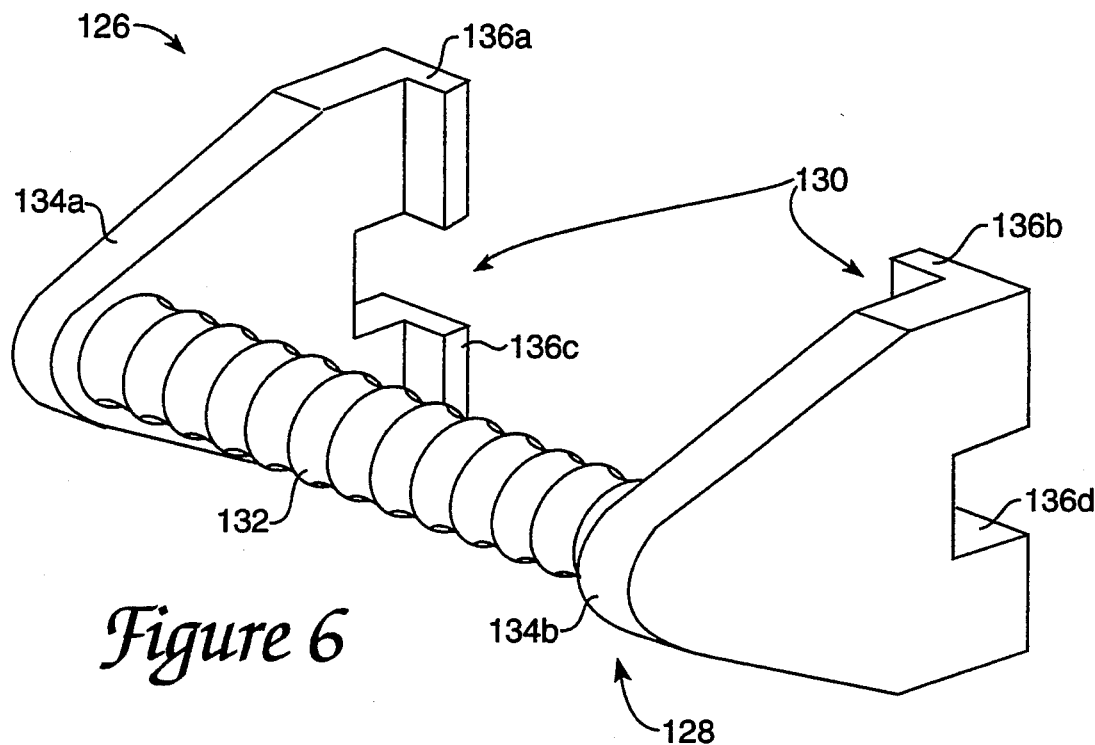
FIG. 6 is a perspective view of an alternative wafer cassette handle of the present invention.

In FIG. 6, a wafer cassette handle 126 according to the above described alternative embodiment is shown. Wafer cassette handle 126 includes a grip portion 128 and an attachment portion 130. Grip portion 128 includes an elongated handle 132 and handle supports 134a and 134b. The elongated handle 132 is attached at its ends to the two handle supports 134a and 134b. Attachment portion 130 includes L-shaped members 136a, 136b, 136c, and 136d.

Figure 7:
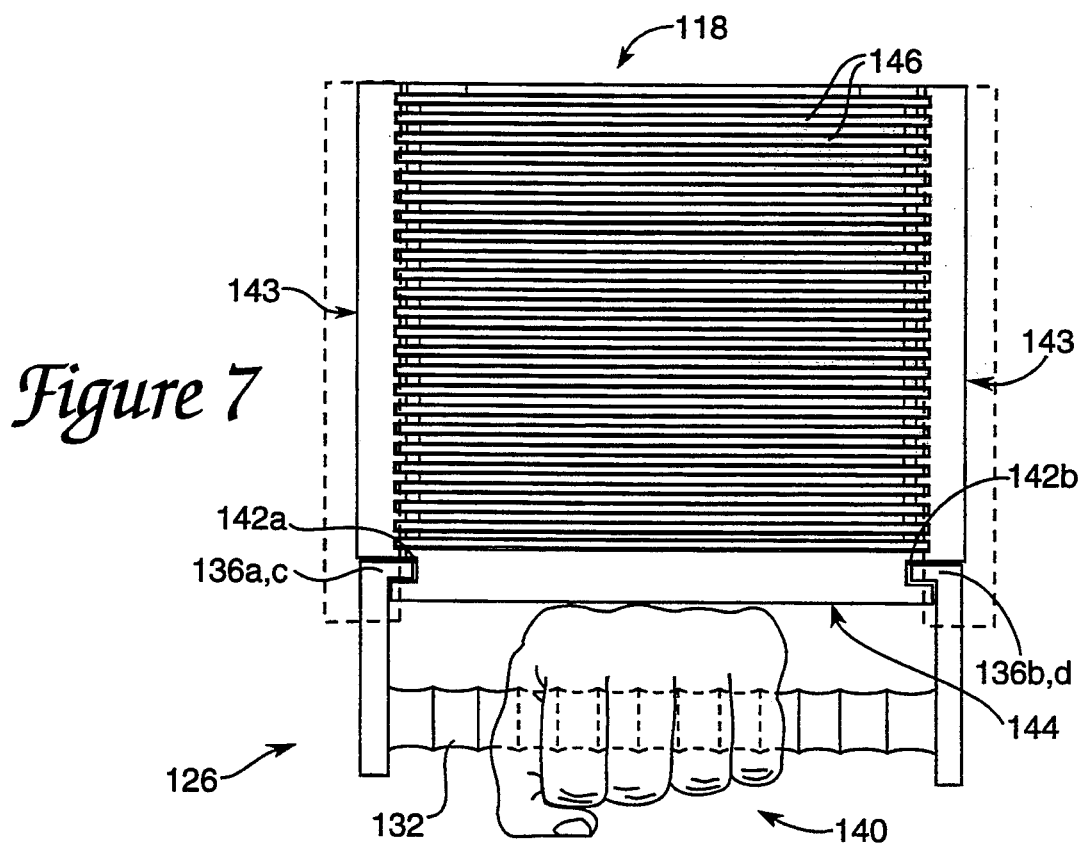
FIG. 7 is a top plan view of a hand holding the wafer cassette handle of FIG. 6 after it has been engaged with a wafer cassette.

FIG. 7 is a top plan view of the wafer cassette handle 126 attached to a wafer cassette 118. A hand 140 is holding the handle in an underhand grip. The L-shaped members 136a,c and 136b,d are engaged with grooves 142a and 142b, respectively, which are positioned in the sides 143 of the cassette 118. Wafers 146 are held in the cassette parallel to the front face 144 in most wafer cassettes.

While this invention has been described in terms of several preferred embodiments, it is contemplated that alterations, modifications and permutations thereof will become apparent to those skilled in the art upon a reading of the specification and study of the drawings. It is intended that the claims include all such alterations, modifications and permutations as fall within the spirit and scope of the present invention.

What is claimed is:

1. A wafer cassette handle comprising:
   a support plate having a hand engaging surface;
   a rigid generally linear handle means coupled to said support plate such that it is substantially horizontal and parallel to said hand engaging surface and is spaced from said hand engaging surface by approximately the thickness of a human hand; and
   cassette engagement means coupled to said support plate for engagement with a portion of a wafer cassette.

2. A wafer cassette handle as recited in claim 1 wherein said hand engaging surface of said support plate is substantially planar.

3. A wafer cassette handle as recited in claim 2 wherein said elongated handle means is substantially cylindrical.

4. A wafer cassette handle as recited in claim 3 wherein the length of said elongated handle means is greater than the width of a human hand.

5. A wafer cassette handle as recited in claim 3 wherein said elongated handle means includes a contoured grip to securely engage a human hand.

6. A wafer cassette handle as recited in claim 2 wherein said cassette engagement means includes a pair of engagement members adapted to engage grooves provided in a wafer cassette.

7. A wafer cassette assembly for carrying a wafer cassette in an underhand fashion, the assembly comprising:
    a wafer cassette provided with a substantially vertical side;
    a rigid generally linear handle means separated from said vertical side and extending substantially horizontally and in parallel thereto, said handle means being separated from said vertical side by approximately the thickness of a human hand, whereby the handle means is arranged such that when it is grasped in an underhand fashion, the back of the hand engages said vertical side of the wafer cassette; and
    attachment means for removably coupling said handle means to said cassette.

8. A wafer cassette assembly as recited in claim 7 further comprising a hand engaging surface coupled between said handle means and said attachment means.

9. A wafer cassette assembly as recited in claim 8 wherein said hand engaging surface is substantially parallel to said vertical side of said wafer cassette.

10. A wafer cassette assembly as recited in claim 9 wherein said handle means is substantially cylindrical.

11. A wafer cassette assembly as recited in claim 7 wherein said attachment means includes a pair of engagement members engaged with vertical grooves provided in said wafer cassette.

12. A method for carrying a wafer cassette comprising:
    engaging a handle assembly with a wafer cassette such that an elongated handle portion is positioned substantially horizontally and in parallel to a vertical side of said cassette and is separated from said vertical side by approximately the thickness of a human hand; and
    grasping said handle portion with an underhand grip such that the back of the hand engages said vertical side of said cassette.

13. A method as recited in claim 12 wherein said step of engaging said handle assembly with said wafer cassette includes engaging members on said handle assembly with grooves provided in said wafer cassette.

14. A method as recited in claim 12 wherein said step of engaging comprises engaging said engaging members with a lower portion of said grooves, sliding said engaging members up said grooves, and engaging said engaging members with stops provided by said wafer cassette.

15. A method as recited in claim 12 wherein said hand grasps a substantially cylindrical handle portion.

16. A method for carrying a wafer cassette with the aid of a handle assembly, the assembly having a support plate with a hand engaging surface and a handle means coupled to the support plate, the method comprising:
    engaging the handle assembly with a wafer cassette such that the handle means is substantially horizontal and in parallel with a vertical side of said support plate and is separated from said support plate by approximately the thickness of a human hand; and
    grasping said handle means with an underhand grip such that the back of the hand engages said support plate.

17. A method as recited in claim 16 wherein said step of engaging said handle assembly with said wafer cassette includes engaging members on said handle assembly with grooves provided in said wafer cassette.

18. A method as recited in claim 16 wherein said step of engaging comprises engaging said engaging members with a lower portion of said grooves, sliding said engaging members up said grooves, and engaging said engaging members with stops provided by said wafer cassette.

19. A method as recited in claim 16 wherein said hand grasps a substantially cylindrical handle portion.

* * * * *